United States Patent
Matsumoto et al.

(10) Patent No.: US 6,525,402 B1
(45) Date of Patent: Feb. 25, 2003

(54) SEMICONDUCTOR WAFER, METHOD OF MANUFACTURING THE SAME AND SEMICONDUCTOR DEVICE

(75) Inventors: Masahiko Matsumoto, Kanagawa-ken (JP); Hisato Oyamatsu, Kanagawa-ken (JP); Takeo Nakayama, Kanagawa-ken (JP); Yasuhiro Fukaura, Kanagawa-ken (JP); Kunihiro Kasai, Kanagawa-ken (JP); Masahiro Inohara, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/395,204

(22) Filed: Sep. 14, 1999

(30) Foreign Application Priority Data

Sep. 15, 1998 (JP) ............................................. 10-280590

(51) Int. Cl.[7] ............................................. H01L 23/58
(52) U.S. Cl. .................... 257/618; 257/629; 257/632; 257/762; 438/471; 148/33
(58) Field of Search ............................. 257/347, 618, 257/629, 762, 787, 632, 66, 72, 566, 567; 148/33; 438/471

(56) References Cited

U.S. PATENT DOCUMENTS 5,233,218 A * 8/1993 Miura ........................ 257/618

5,831,283 A 11/1998 Batey et al.
6,174,810 B1 * 1/2001 Islam et al. .................. 438/687
6,194,310 B1 * 2/2001 Hsu et al. .................... 438/643

FOREIGN PATENT DOCUMENTS

JP 5-235006 9/1993

* cited by examiner

Primary Examiner—Steven Loke
Assistant Examiner—Donghee Kang
(74) Attorney, Agent, or Firm—Finnegan, Henderson, Farabow, Garrett & Dunner, L.L.P.

(57) ABSTRACT

The object of the present invention is to provide a semiconductor wafer in which a diffusion of Cu generated by a thermal treatment such as a Cu wiring formation step into silicon is prevented, and variations of transistor characteristics are lessened. The object of the present invention is to provide a method of manufacturing the same and a semiconductor device formed from the same.

In the present invention, a protection insulating film for preventing Cu from diffusing into the inside of the wafer is formed on a peripheral portion of a principal plane, a external side plane and a rear plane of the wafer. With this protection insulating film, the diffusion of Cu that is a wiring material into a chip formation region of the wafer is prevented, so that the variations of the transistor characteristic.

6 Claims, 13 Drawing Sheets

PERIPHERAL REGION    CHIP AREA

SEMICONDUCTOR WAFER, METHOD OF MANUFACTURING THE SAME AND SEMICONDUCTOR DEVICE

BACKGROUND OF THE INVENTION

1. Field of the Invention

The present invention relates to a semiconductor wafer (hereinafter, referred to as a wafer) in which a semiconductor device is formed, a novel semiconductor device exhibiting less variation in a transistor characteristic, and a method for manufacturing the same.

2. Description of the Related Art

A wafer formed of silicon or germanium, which is used for a semiconductor device, has heretofore been manufactured usually by slicing a cylindrical ingot that is grown by a single crystal growth method such as a high frequency induction-heating method or a pulling-up method. A plurality of processed semiconductor integrated circuits are formed on a principal plane of the wafer which has been formed from the ingot. Thereafter, the wafer is cut along scribe lines into chips in which an integrated circuit area is formed, and the chips are separated from each other.

FIG. 1 is a section view showing a conventional semiconductor device formed in a semiconductor substrate. The semiconductor device is formed on a wafer, and the wafer is cut into chips in which an integrated circuit is formed. The chips are finally separated from each other. Accordingly, FIG. 1 is a section view of the chip, and especially illustrates a chip formed in a portion of the wafer, which is close to an external peripheral surface and a peripheral region where no integrated circuit is formed. A semiconductor substrate 1 is, for example, a p-type silicon semiconductor. The left side of FIG. 1 is an external peripheral portion of the wafer and a peripheral portion thereof, and in these portions the surface of the semiconductor substrate 1 is exposed for the reason described later. An inner portion of the external peripheral portion and the peripheral portion, that is, a central portion and a right side, show a chip region. In the chip region, an element isolation region 2 formed of silicon dioxide (SiO2), which has a Shallow Trench Isolation (STI), is formed by a Local Oxidation of Silicon (LOCOS) method. N-type source/drain regions 3 are formed in an element region partitioned by the element isolation region 2. A gate electrode 5 formed of polysilicon or the like is formed by a thermal oxide method on a portion of a gate insulating film formed of a silicon oxide film, the portion thereof being located between the source/drain regions 3. The gate insulating film 4 is formed on the entire surface of the semiconductor substrate 1, and, on the semiconductor substrate 1, a silicon oxide film is formed so as to cover the gate electrode 5.

The silicon oxide film is subjected to an anisotropic etching such as an RIE (Reactive Ion Etching) and processed to a side wall insulating film 6 left on the side wall of the gate electrode 5. Subsequently, on the semiconductor substrate 1, an interlayer insulating film 7 formed of such as BPSG (Boron-doped Phospho-Silicate Glass) is deposited, and flattened. A contact hole which communicates with one of the source/drain regions 3 is formed in the interlayer insulating film 7, and a connection wiring 8 formed of such as tungsten,for example (W) is filled in the contact hole. A metal film formed of copper (Cu) is deposited on the flattened surface of the interlayer film 7, and patterned, thus forming a copper wiring 9 electrically connected to the connection wiring 8. On the copper wiring 9, a protection insulating film can be formed, or a plurality of copper wirings can be formed interposing the interlayer insulating film during the formation of the protection insulating film.

The above-described copper wiring technology used for semiconductor devices has been involved in a problem that diffusion of copper into a silicon wafer is seriously anxious for.

In the conventional copper wiring technology, copper is principally covered with a barrier film such as Ta, TiN and SiN. However, copper may attach to a wafer edge and a rear surface of the wafer during formation of the barrier film, or the copper may attach to them from a manufacturing apparatus and a wafer carrier. Since resist is usually removed from the wafer edge by about 1 to 3 mm before the time of patterning the wafer, the surface of the semiconductor substrate corresponding to the portion where the resist is removed is exposed after an etching treatment.

A SiN film is formed on a region where transistors are formed, so that the diffusion of the copper into that region can be prevented. However, the silicon substrate formed of silicon is exposed in its rear surface and its wafer edge portion, and in such situation, when the wafer is subjected to the copper processing step, the copper diffuses into a chip from the external periphery of the wafer, so characteristics of the transistors formed in the chip may vary.

To be more specific, with regard to the conventional semiconductor substrate, for example, a silicon wafer is formed of only silicon. In order to prevent the attachment of resist to the carrier, the resist of the periphery portion of the wafer is removed in manufacturing steps of the semiconductor device using such wafer, especially in a lithography step as described above. Accordingly, since the wafer edge portion is always exposed to etching atmosphere, so that the silicon substrate comes to be exposed. As a result, the contamination of the semiconductor substrate due to the attachment of the copper to the silicon portion in forming the copper wiring occurs as described above. Furthermore, there has been a problem that when a high concentration semiconductor substrate having a p-type epitaxial silicon semiconductor layer formed therein (p-epi on $p^+$ substrate) is employed, impurities diffuse to the outside of the semiconductor substrate during a thermal step.

SUMMARY OF THE INVENTION

The present invention was made in view of the foregoing circumstances, and the object of the present invention is to provide a wafer which prevents a diffusion of copper to silicon due to a thermal treatment such as a copper wiring formation step and lessens the variations in transistor characteristics, a method for manufacturing the same, and a semiconductor device formed of the same.

The present invention is featured by forming a protection insulating film in a peripheral area (peripheral portion) of a principal plane of the wafer, an external side plane and a rear plane, which prevents a diffusion of copper to the inside of the wafer, specifically a protection insulating film formed of a material having a small Cu diffusion coefficient. The protection insulating film prevents the copper that is a wiring material from diffusing into a chip formation region of the wafer, and controls the changes of transistor characteristics caused by the Cu diffusion.

The wafer of the present invention is first characterized in that the wafer has a semiconductor wafer having a first plane where an integrated circuit is formed, a second plane and a peripheral area, and a protection film formed in the second plane and the peripheral area. The wafer of the present invention is secondly characterized in that the wafer has a semiconductor wafer having a first plane where an integrated circuit is formed, a second plane and a peripheral area, and a protection film formed of silicon nitride, which is formed in the second plane and the peripheral area.

A first aspect of a method for manufacturing the wafer of the present invention is that the method comprises the step of: forming a protection film on a first plane having an integrated circuit formed therein, a second plane and a peripheral area of a semiconductor wafer; and removing the protection film in a region forming the integrated circuit on the first plane. A MOS transistor which has a gate electrode having a side wall insulating film on its side wall is included in the integrated circuit. The foregoing protection insulating film may be formed in the step for forming this side wall insulating film.

Furthermore, a second aspect of the method for manufacturing the wafer of the present invention is that the method comprises the steps of: growing a cylindrical semiconductor single crystal ingot; forming a protection insulating film in a surface of the single crystal ingot, the protection insulating film preventing a diffusion of copper into the interior of the single crystal ingot; and slicing the single crystal ingot, thereby forming a plurality of semiconductor wafers, each having an external side plane, in which the protection insulating film is formed. The second aspect of the method for manufacturing the wafer of the present invention may comprises a step for forming a protection insulating film which extends to the external side plane and prevents the diffusion of the copper to the interior of the semiconductor wafer.

A semiconductor device of the present invention comprises a semiconductor chip having a first plane where an integrated circuit is formed and a second plane, the integrated circuit formed in the first plane; and a protection insulating film formed on the entire surface of the second plane.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

Embodiments of the present invention will be described with reference to the accompanying drawings in detail. A first embodiment will be described with reference to FIGS. 2 to 6.

Figure 1:
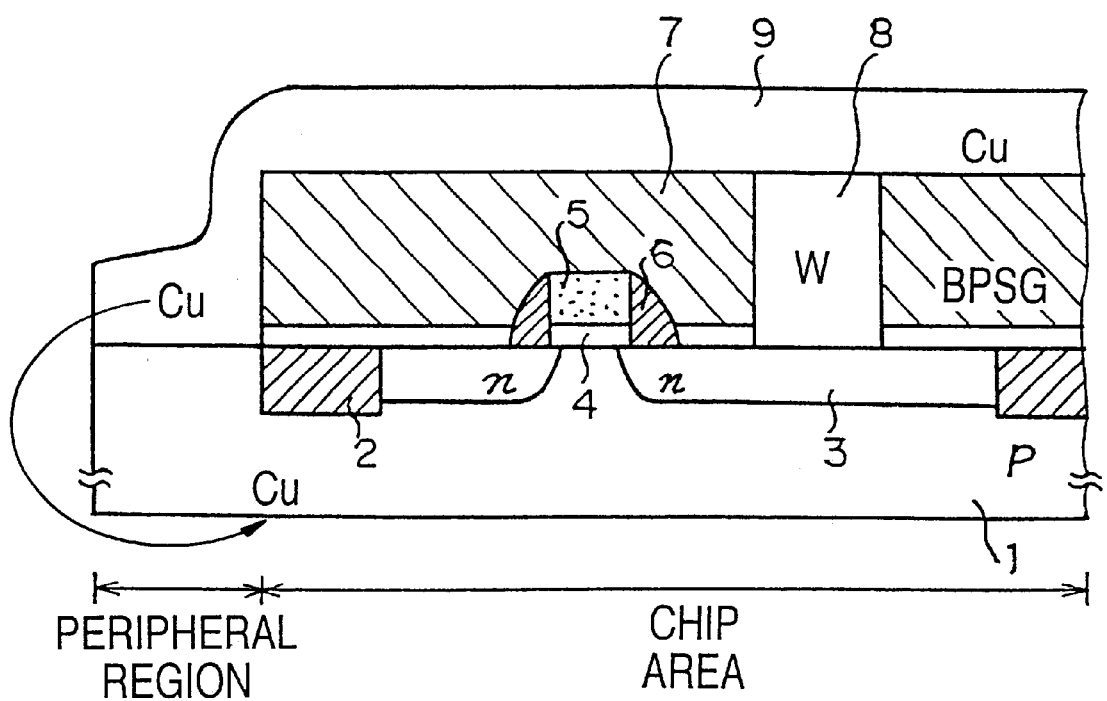
FIG. 1 is a section view showing a manufacturing step of a conventional semiconductor device.
Figure 2:
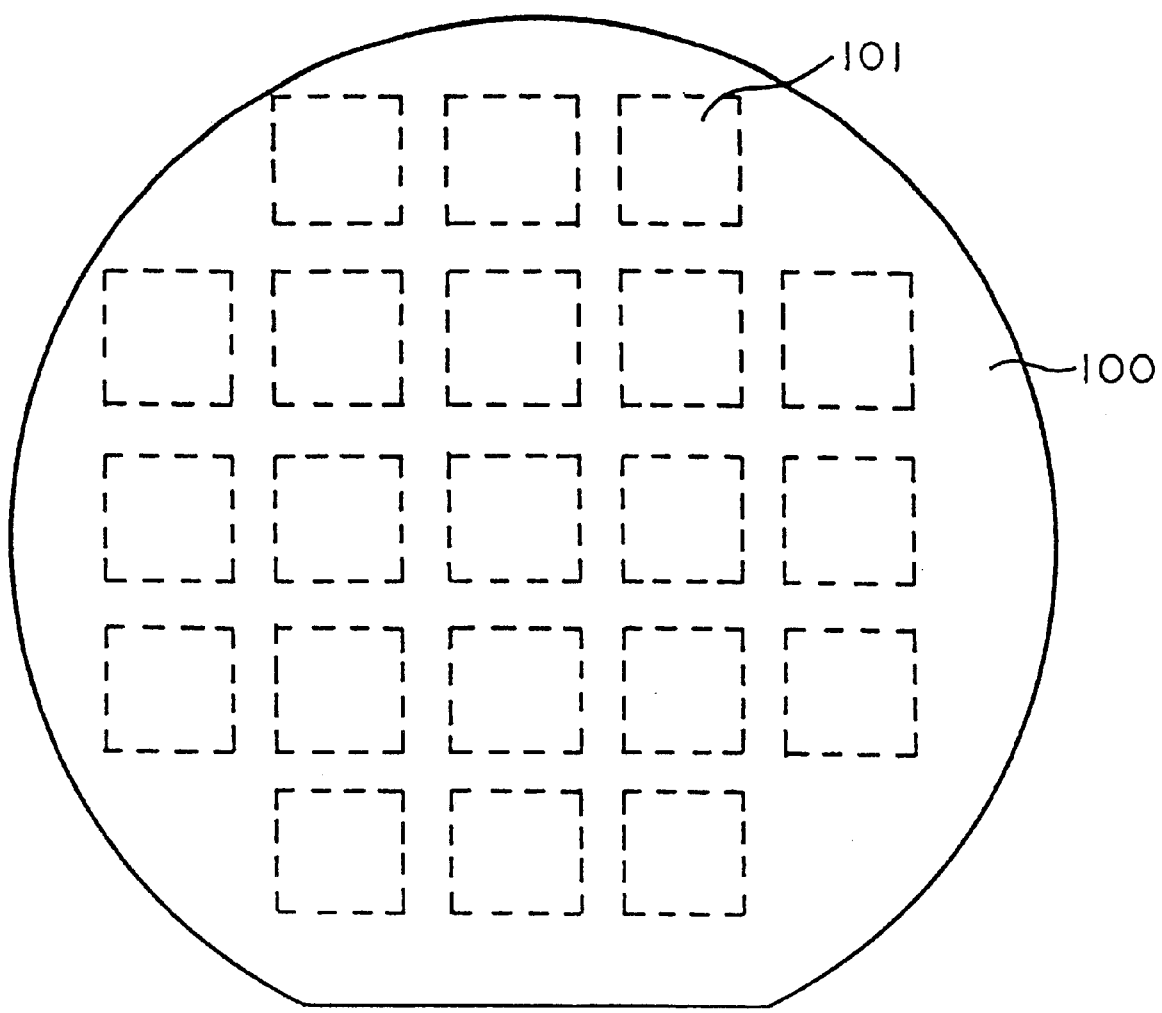
FIG. 2 is a plan view showing a principle plane of a wafer of a first embodiment.
Figure 3A:
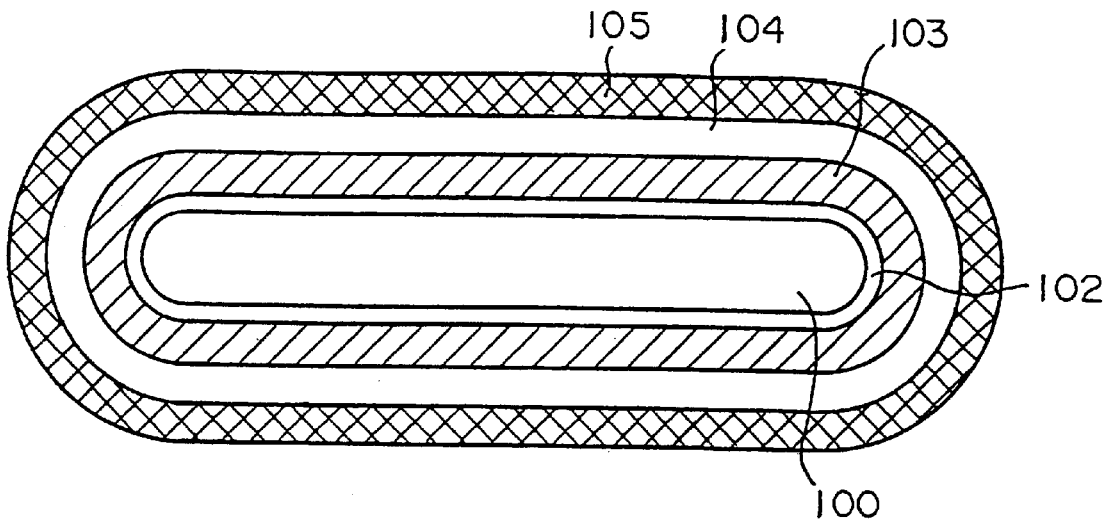
FIGS. 3(a) and 3(b) are section views showing manufacturing steps for manufacturing the wafer of the first embodiment.
Figure 3B:
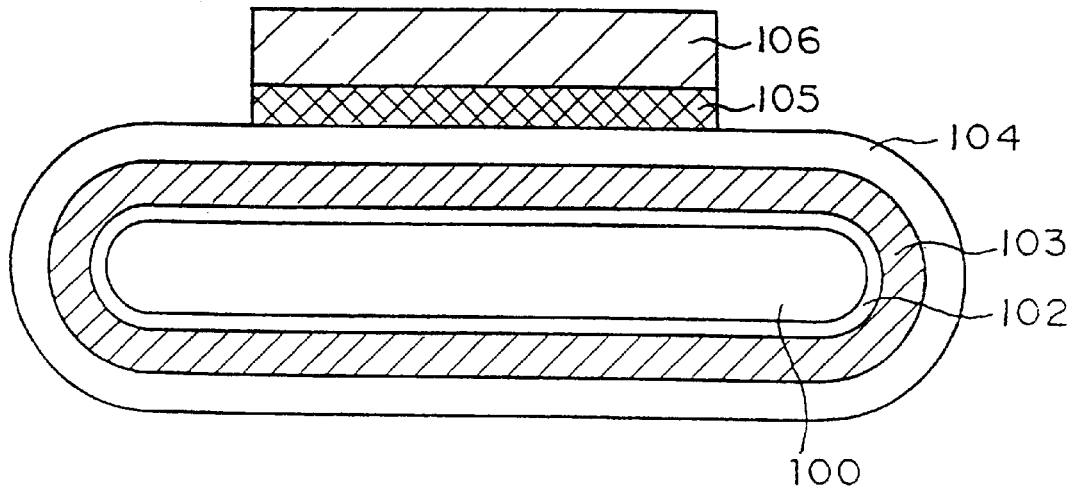
Figure 4A:
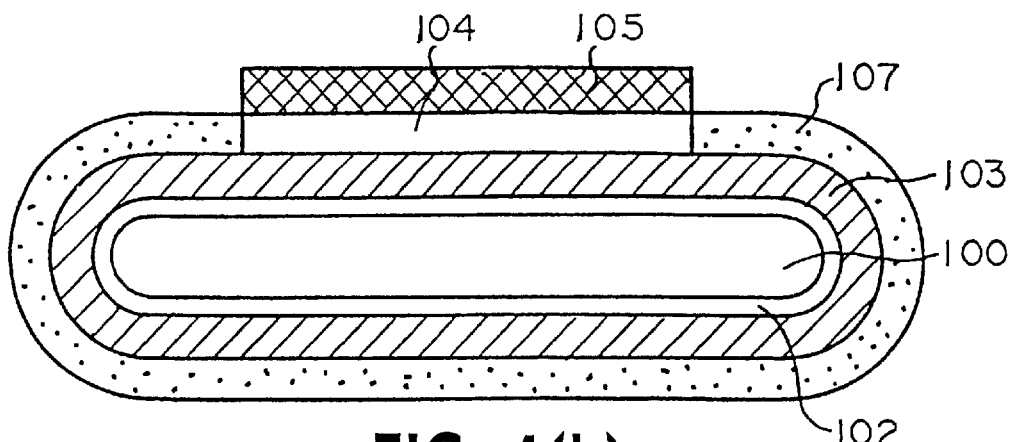
FIGS. 4(a) and 4(b) are section views showing manufacturing steps for manufacturing the wafer of the first embodiment.
Figure 4B:
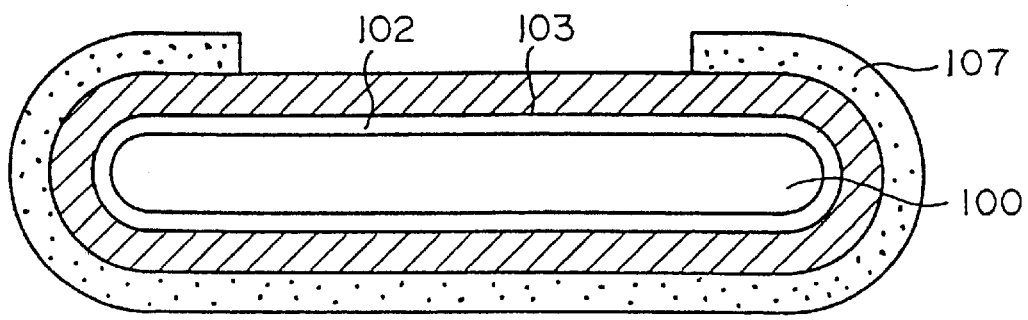
Figure 5:
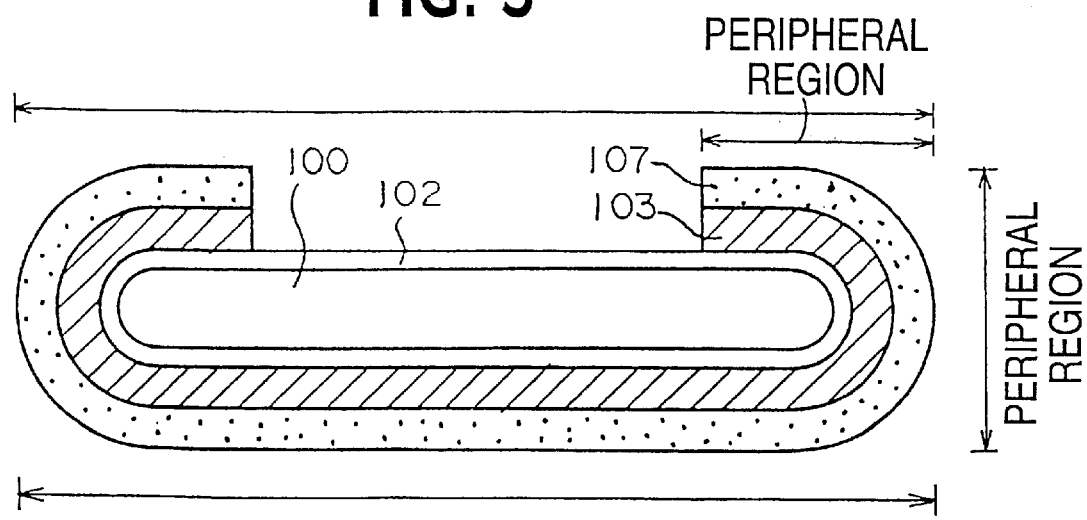
FIG. 5 is a section view showing a manufacturing steps for manufacturing the wafer of the first embodiment.
Figure 6:
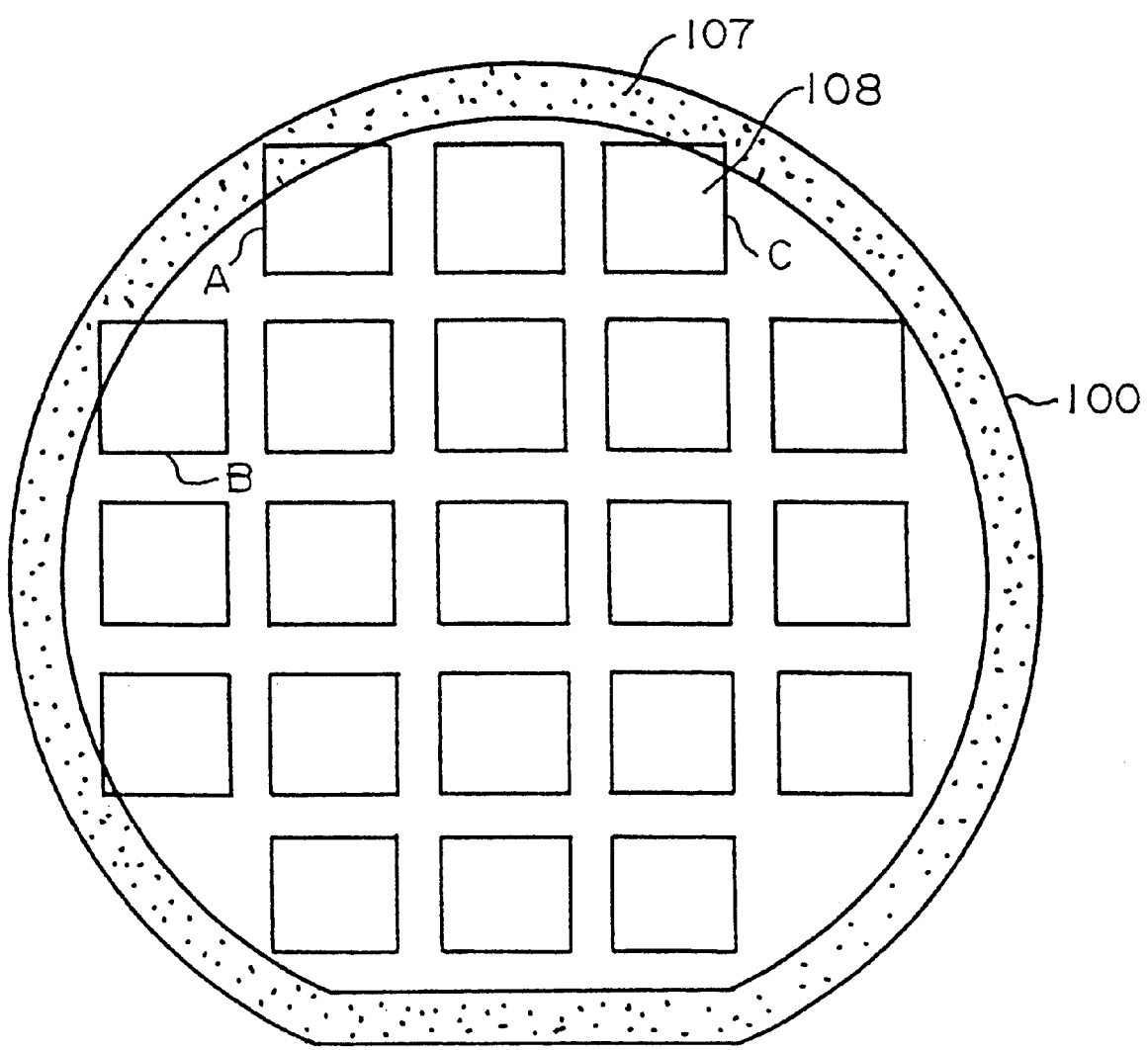
FIG. 6 is a plan view showing a principal plane of the wafer of the first embodiment.

FIG. 2 is a plan view of a principal plane of a wafer, FIGS. 3(a) to 5 are section views of the wafer, and FIG. 6 is a plan view of the principal plane of the wafer after formation of a chip in its chip formation region. A wafer 100 is formed of, for example, a p-type silicon semiconductor substrate which is obtained by slicing an semiconductor ingot and processing to a predetermined shape. A trench is formed in its principal plane, and an insulating film such as a silicon oxide film ($SiO_2$) is filled in the trench. Thus, an element isolation region such as an STI structure is formed. A chip formation region 101 is formed on the principal plane of the wafer 100 when the STI structure is formed. After the element isolation region is formed, a silicon oxide (SiO2) film 102 is formed on the entire surface of the wafer 100 by a thermal oxidation and the like. Next, a silicon nitride (SiN) film 103 is deposited on the silicon oxide film 102 by a LPCVD (Low Pressure Chemical Vapor Deposition) method. Subsequently, a polysilicon film 104 is deposited on the silicon nitride film 103 by the LPCVD method. Furthermore, a silicon nitride film 105 is deposited on the polysilicon film 104 by the LPCVD method (FIG. 3(a)).

Next, photoresist 106 is applied onto the silicon nitride film 105 formed on the principal plane of the wafer 100, and the photoresist 106 on the peripheral portion of the wafer 100 is removed by patterning the photoresist 106. Then, the portions of the silicon nitride film 105 on the peripheral portion of the principal plane, the external side plane and the rear plane of the wafer 100 are removed by an isotropic etching such method as an RIE using the patterned photoresist 106 as a mask. Specifically, the silicon nitride film 105 and the photoresist 106 formed on the silicon nitride film 105 cover the region other than the peripheral portion of the principal plane where the chip is to be formed (FIG. 3(b)).

Next, the photoresist 106 is removed, and then the polysilicon film 104 on the peripheral portion of the principal plane of the wafer 100, the external side plane of the wafer 100 and the rear plane of the wafer 100 is oxidized by a thermal treatment step, and a silicon oxide film 107 is formed (FIG. 4(a)). Subsequently, the silicon nitride film 105 is removed, and thereafter the polysilicon film 104 which has been covered with the silicon nitride film 105 is removed by, for example, a dry etching method, so as to expose the silicon nitride film 103 partially (FIG. 4(b)). Next, the exposed silicon nitride film 103 is removed by hot phosphoric acid using the silicon oxide film 107 on the peripheral portion of the principal plane of the wafer 100, the external side plane of the wafer 100, and the rear plane of the wafer 100 as a mask (FIG. 5).

Thus, the main central area of the principal plane of the wafer 100 where the chip is formed is covered with the silicon oxide film 102, and the peripheral portion of the principal plane, the external side plane, and the rear plane are covered with a stacked body composed of the silicon nitride film 103 and the silicon oxide film 107. The silicon oxide film 102 is used as a gate insulating film formed on the wafer 100.

The wafer 100 is subjected to treatments (a thin film formation treatment, an oxidation treatment, a doping treatment, an annealing treatment, a resist treatment, an exposure treatment, an etching treatment and the like) after the element isolation region formation step and the gate insulating film formation step, thus forming an integrated circuit in each of the chip formation region 101, and the chip formation region 101 is processed to the chip 108. Thereafter, the wafer 100 is cut along the scribe line formed in its principal plane, and the chip 108 is separated from each other (FIG. 6). Since the chips A, B and C partially covered with the protection insulating film 107 shown in FIG. 5 sometimes exhibit unstable characteristics, these chips are not used as the product.

Since the wafer used in this embodiment is covered with the silicon nitride film covered with the silicon oxide film in its peripheral portion of the principal plane, its external side plane and its rear plane, it is possible to prevent the silicon substrate from being exposed in its peripheral portion of the principal plane during the Cu wiring formation step among the foregoing treatment steps. As a result, diffusion of copper that is a wiring material into the chip formation region of the wafer can be prevented, and variations of transistor characteristics due to the copper diffusion can be controlled. Specifically, the silicon nitride film and the silicon oxide film are used as a protection insulating film for preventing the copper diffusion.

Next, a second embodiment will be described with reference to FIGS. 7 and 8.

Figure 7A:
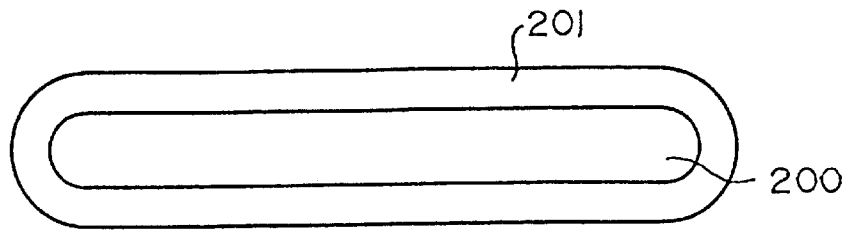
FIGS. 7(a) and 7(b) are section views showing manufacturing steps for manufacturing a wafer of a second embodiment.
Figure 7B:
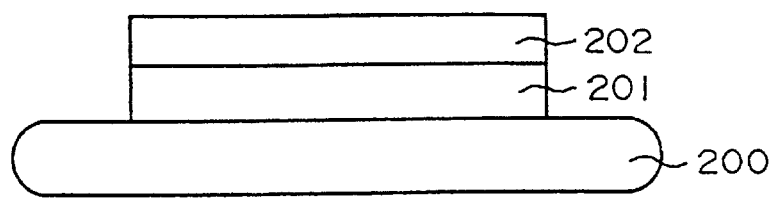
Figure 8:
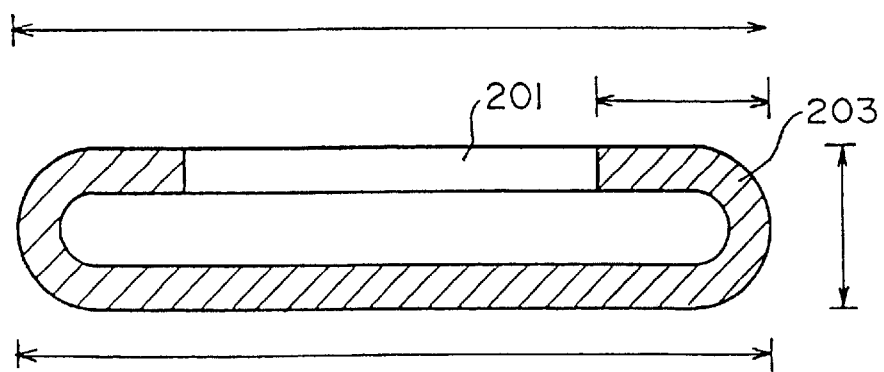
FIG. 8 is a section view showing a manufacturing step of the wafer of the second embodiment.

FIGS. 7 and 8 are section views of a wafer. The wafer 200 is formed of, for example, a p-type silicon semiconductor substrate obtained by slicing an ingot and processing to a predetermined shape. The wafer 200 forms a trench in its principal plane, and an insulating film such as a silicon oxide ($SiO_2$) film is filled in the trench, thus forming an element isolation region of an STI structure. When the element isolation region is formed, a chip formation region (not shown) is formed in the principal plane of the wafer 200. After the formation of the element isolation region, a silicon oxide ($SiO_2$) film 201 is deposited by, for example, an LPCVD method on the entire surface of the silicon wafer 200 (FIG. 7(a)).

Subsequently, photoresist 202 is applied onto the silicon oxide film 201 on the principal plane of the wafer 200, and the photoresist is patterned, thus removing the portion of the photoresist 202 on the peripheral portion of the principal plane of the wafer 200. Then, the silicon oxide film 201 on the peripheral portion of the principal plane, the external side plane and the rear plane of the wafer 200 is removed by an isotropic etching such as an RIE. Thus, the region other than the peripheral portion of the principal plane, where chips are to be formed, is covered with the silicon oxide film 201, and the photoresist 202 is left on the film 201 (FIG. 7(b)).

Next, after removing the photoresist 202, a silicon nitride film 203 is deposited on the silicon oxide film 201 by, for example, a LPCVD method. Thereafter, the surface of the silicon nitride film 203 is subjected to a flattening treatment by a CMP (Chemical Mechanical Polishing) technique using the silicon oxide film 201 as a stopper until the silicon oxide film 201 is exposed (FIG. 8). As a result of the flattening treatment, the situation where the silicon nitride film 203 is formed on the peripheral portion of the wafer 200 and the rear plane thereof is created. The silicon oxide film 201 is afterward removed by etching.

Thus, the peripheral portion of the principal plane, the external side plane and the rear plane of the wafer 200 are covered with the silicon nitride film 203. The wafer 200 is subjected to treatments (a thin film formation treatment, an oxidation treatment, a doping treatment, an annealing treatment, a resist treatment, an exposure treatment, an etching treatment and the like) after the element isolation region formation step, thus forming an integrated circuit in each of the chip formation region, and the chip formation regions are processed to the chip 108. Thereafter, the wafer is cut along the scribe line formed in its principal plane, and the chips are separated from each other.

Since the wafer used in this embodiment is covered with the silicon nitride film covered with the silicon oxide film in its peripheral portion of the principal plane, its external side plane and its rear plane, it is possible to prevent the silicon substrate from being exposed in its peripheral portion of the principal plane during the Cu wiring formation step among the foregoing treatment steps. Specifically, the silicon nitride film is used as a protection insulating film for preventing the copper diffusion. By the presence of this protection insulating film, diffusion of copper that is a wiring material into the chip formation region of the wafer can be prevented, and variations of transistor characteristics due to the copper diffusion can be controlled.

Next, a third embodiment of the present invention will be described with reference to FIGS. 9 and 10(a) and 10(b).

Figure 9:
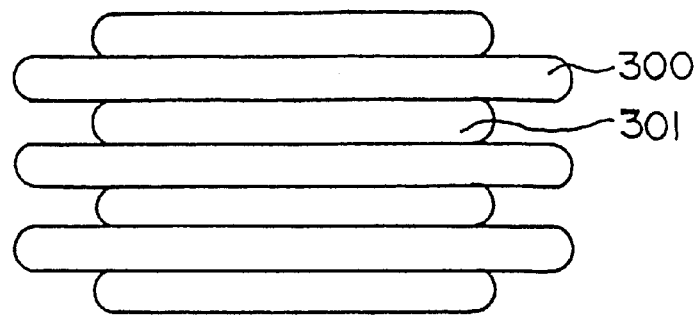
FIG. 9 is a section view showing a manufacturing step of a wafer of a third embodiment.
Figure 10A:
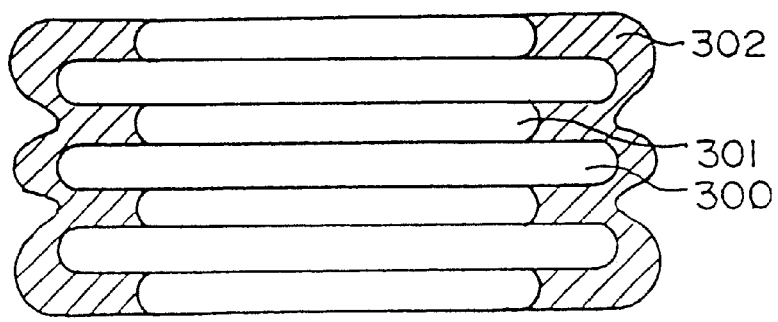
FIGS. 10(a) and 10(b) are section views showing manufacturing steps for manufacturing the wafer of the third embodiment.
Figure 10B:
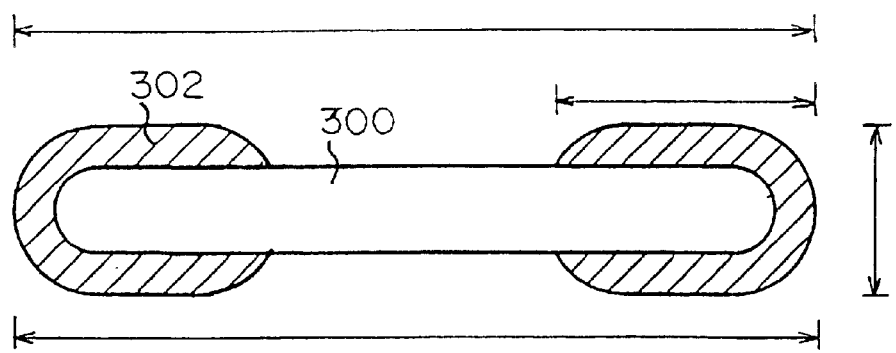

FIGS. 9, 10(a) and 10(b) are section views for explaining manufacturing steps to form a protection insulating film on a wafer.

The wafer 300 is formed of, for example, a p-type silicon semiconductor substrate obtained by slicing an ingot and processing to a predetermined shape. This embodiment has a feature in that in order to form the protection insulating film, a dummy wafer is employed.

The silicon wafer 300 and the dummy wafer 301 having a diameter slightly smaller than that of the wafer 300 are stacked. The peripheral portion of the silicon wafer 300 projects from the dummy wafer after stacking the wafer 300 and the dummy wafer 301 upon another (FIG. 9). In a situation where the plurality of silicon wafers and dummy wafers are placed upon another, a silicon nitride (SiN) film is deposited by a LPCVD method around the lamination body composed of the plurality of silicon wafers and dummy wafers (FIG. 10(a)). Thereafter, when the silicon wafers are separated from the lamination body, the silicon wafer having a wafer edge portion in which the silicon nitride film is deposited is prepared (FIG. 10(b)). However, the central portion of the rear plane is not covered with the silicon nitride film as shown in FIG. 10(b). Accordingly, before the Cu wiring step is performed, the silicon nitride film is left as a protection insulating film for preventing the diffusion of copper to the interior of the wafer in the wafer processing step when the side wall insulating film of the gate electrode is formed by the silicon nitride film. Thus, it is possible to cover a specified portion with the protection insulating film completely. In other words, in such case, the protection insulating film is formed in the two steps, that is, in the pretreatment prior to the wafer processing step and in the wafer processing step.

As described above, the peripheral portion of the principal plane, the side plane and the rear plane of the wafer 300 are covered with the silicon nitride film 302. The wafer 300 is subjected to treatments (a thin film formation treatment, an oxidation treatment, a doping treatment, an annealing treatment, a resist treatment, an exposure treatment and an etching treatment) after the element isolation region formation step, and an integrated circuit is formed in each chip formation region. The chip formation region is processed to a chip. Thereafter, the wafer is cut along the scribe line formed in the principal plane of the wafer 300, and the chip is separated from each other.

Since the wafer used in this embodiment is covered with the silicon nitride film covered with the silicon oxide film in its peripheral portion of the principal plane, its external side plane and its rear plane, it is possible to prevent the silicon substrate from being exposed in its peripheral portion of the principal plane during the Cu wiring formation step among the foregoing treatment steps. Specifically, the silicon nitride film is used as a protection insulating film for preventing the copper diffusion. By the presence of this protection insulating film, diffusion of copper that is a wiring material into the chip formation region of the wafer can be prevented, and variations of transistor characteristics due to the copper diffusion can be controlled. Moreover, since the step in the wafer processing steps is used, the step is simplified.

A material of the dummy wafer is not limited to silicon, any material may be satisfactorily used for the dummy wafer as long as the dummy wafer is used for a spacer.

Next, a fourth embodiment will be described with reference to FIGS. 11(a) to 14.

Figure 13:
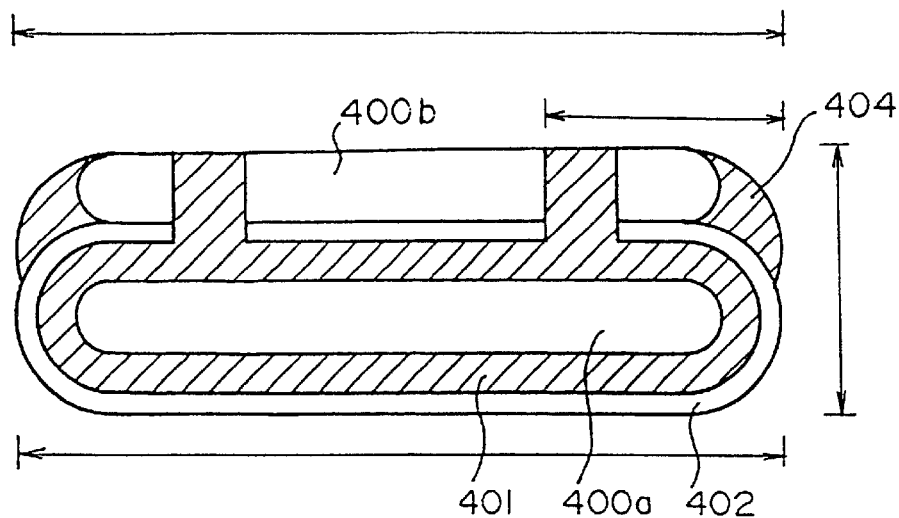
FIG. 13 is a section view showing a manufacturing step for manufacturing the wafer of the fourth embodiment.

This embodiment has a feature in that two wafers are adhered to each other, thus forming a single wafer. FIGS. 11(a), 11(b) and FIGS. 12(a), 12(b) are sectional views for explaining steps to form a protection insulating film on a wafer, and FIG. 13 is a plan view of the wafer. The wafers 400a and 400b are formed of, for example, a p-type silicon semiconductor substrate, which is obtained by slicing an ingot and by processing to a predetermined shape. A silicon nitride film 401 is deposited on the entire surface of the wafer 400a by a LPCVD method. Subsequently, the surface of the silicon nitride film 401 is oxidized by a thermal treatment, and a silicon oxide film 402 is formed (FIG. 11(a)).

Figure 11A:
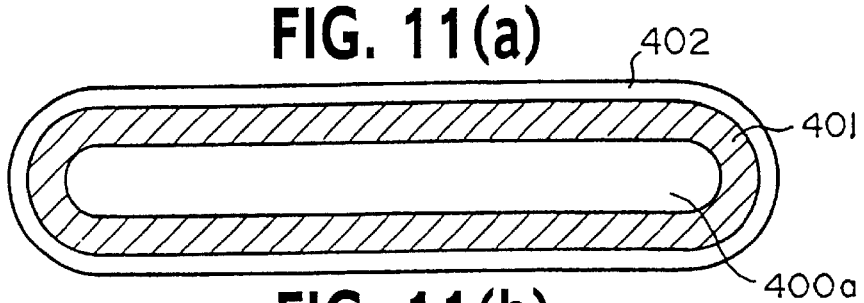
FIGS. 11(a) and 11(b) are section views showing manufacturing steps for manufacturing a wafer of a fourth embodiment.
Figure 11B:
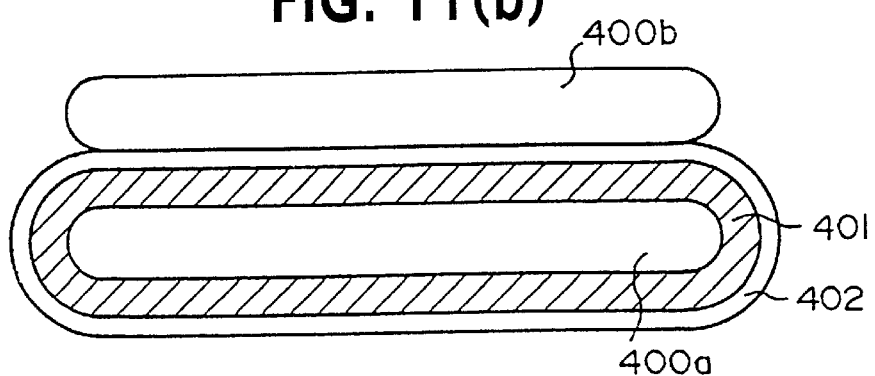
Figure 12A:
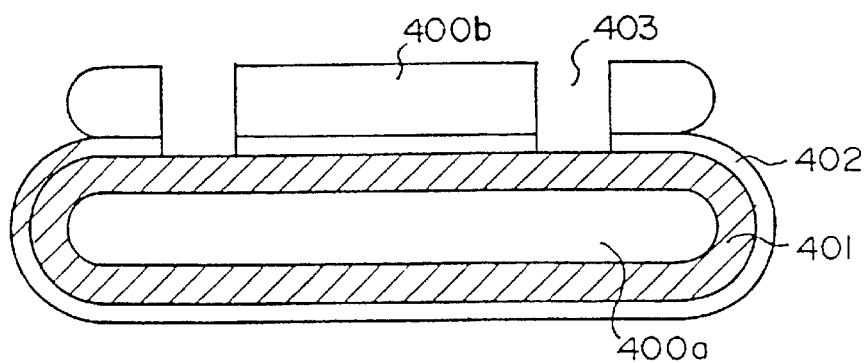
FIGS. 12(a) and 12(b) are section views showing manufacturing steps for manufacturing the wafer of the fourth embodiment.
Figure 12B:
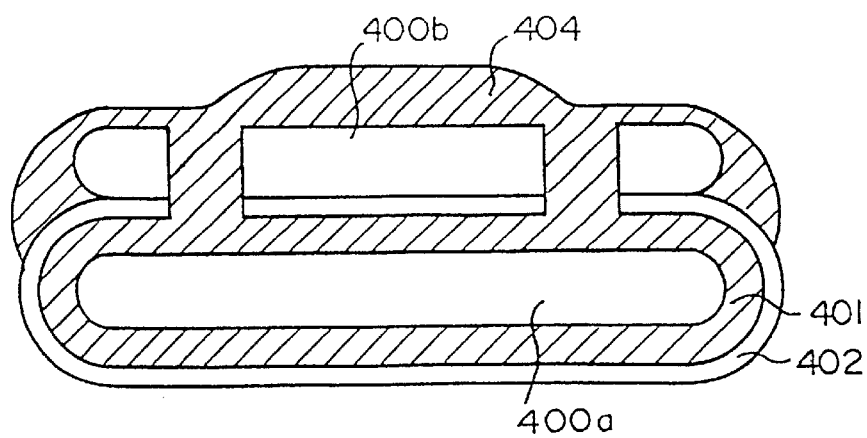

Next, the other silicon wafer 400b is integrated with the wafer 400a by adhering the wafer 400b to the silicon oxide film 402 formed on the silicon nitride film 401 (FIG. 11(b)). Subsequently, photoresist (not shown) patterned is applied onto the wafer 400b, and thereafter the wafer 400b is etched by a RIE using the photoresist as a mask. Thus, a trench 403 reaching to the silicon nitride film 401 is formed on the peripheral portion of the principal plane of the wafer 400b (FIG. 12(a)). A silicon nitride film 404 is deposited by a CVD method (FIG. 12(b)). Thereafter, the surface of the silicon nitride film 404 is flattened by a CMP until the principal plane of the wafer 400b is exposed (FIG. 13).

Figure 14:
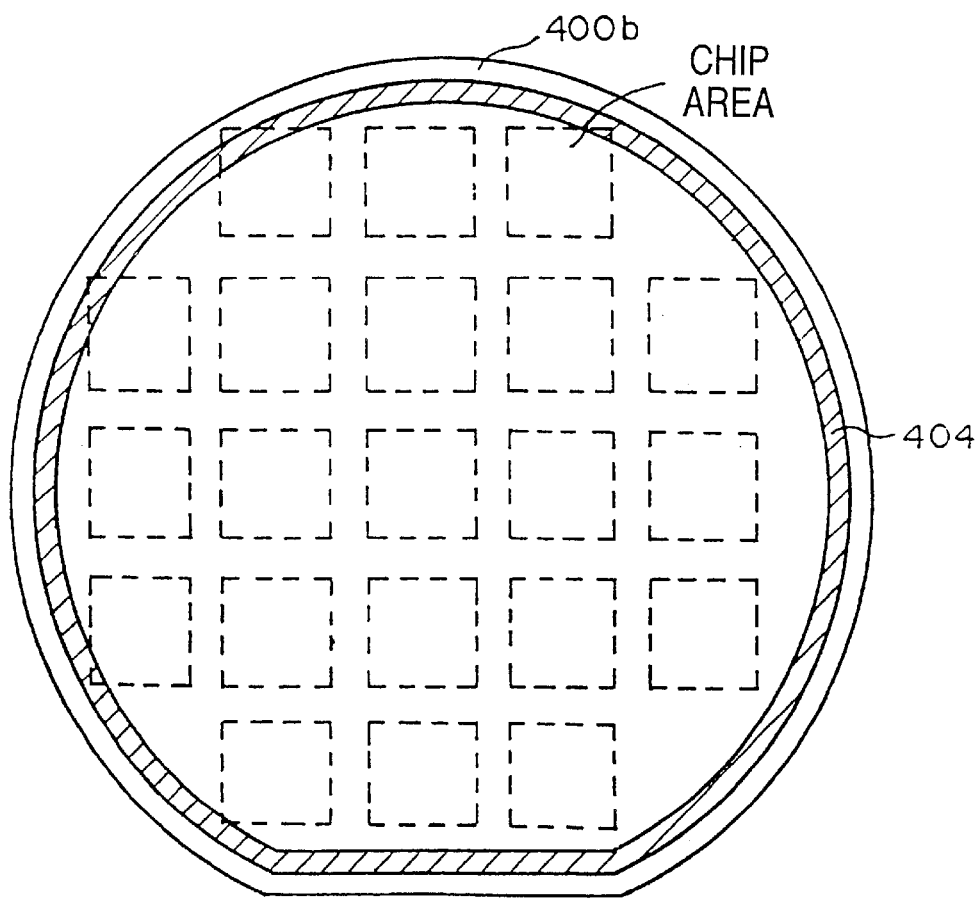
FIG. 14 is a plan view showing a principal plane of the wafer of the fourth embodiment.

It is possible to produce a situation where a part of the peripheral portion of the principal plane, the external side plane and the rear plane of the wafer 400b are covered with the silicon nitride film. Although the part of the peripheral portion of the principal plane is exposed as shown in FIG. 14, the copper never enters from the peripheral portion of the wafer 400b into the central portion thereof.

As described above, the peripheral portion of the principal plane, the external side plane and the rear plane of the wafer are covered with the silicon nitride film. The wafer is subjected to treatments (a thin film formation treatment, an oxidation treatment, a doping treatment, an annealing treatment, a resist treatment, an exposure treatment and an etching treatment) after the element isolation region formation step, and an integrated circuit is formed in each chip formation region. The chip formation region is processed to a chip. Thereafter, the wafer is cut along the scribe line formed in the principal plane of the wafer, and the chip is separated from each other.

Since the wafer used in this embodiment is covered with the silicon nitride film covered with the silicon oxide film in its peripheral portion of the principal plane, its external side plane and its rear plane, it is possible to prevent the silicon substrate from being exposed in its peripheral portion of the principal plane during the Cu wiring formation step among the foregoing treatment steps. Specifically, the silicon nitride film is used as a protection insulating film for preventing the copper diffusion. By the presence of this protection insulating film, the diffusion of copper that is a wiring material into the chip formation region of the wafer can be prevented, and variations of transistor characteristics due to the copper diffusion can be controlled. Moreover, since the step in the wafer processing steps is used, the step is simplified.

Next, a fifth embodiment of the present invention will be described with reference to FIGS. 15 to 18.

Figure 15:
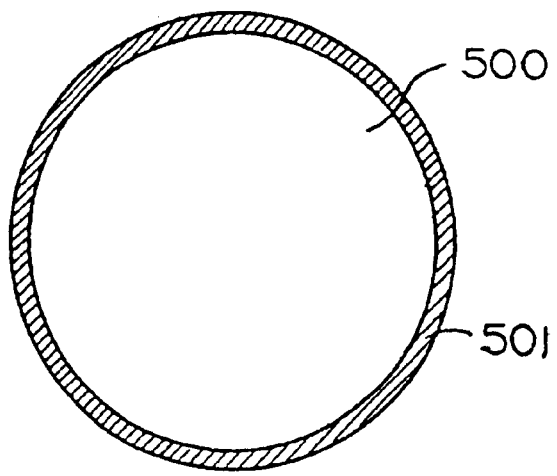
FIG. 15 is a plan view showing a principal plane of a wafer of a fifth embodiment.
Figure 16:
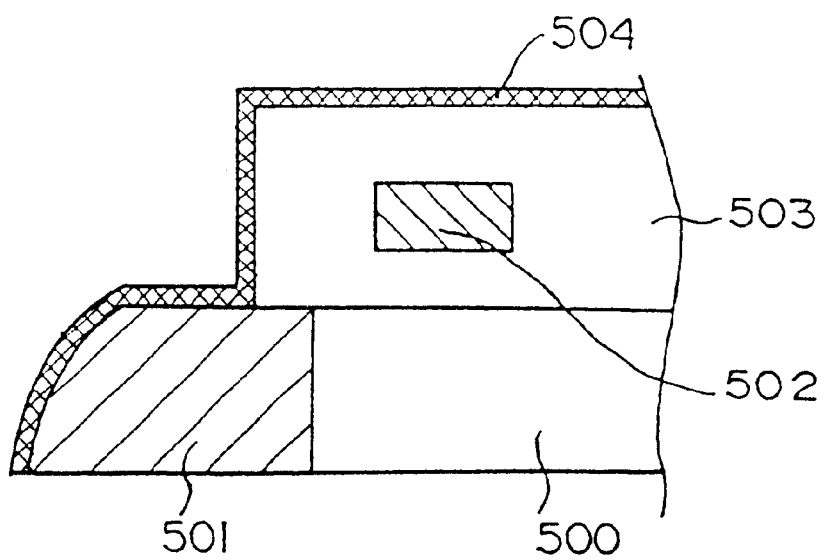
FIG. 16 is a plan view of a semiconductor substrate of the fifth embodiment.
Figure 17A:
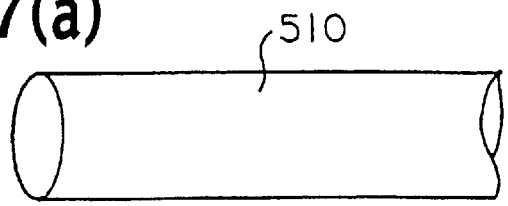
FIGS. 17(a) and 17(b) are perspective views of an ingot of the fifth embodiment.
Figure 17B:
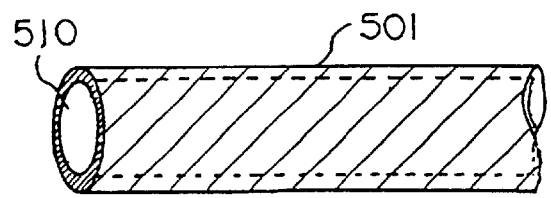
Figure 18A:
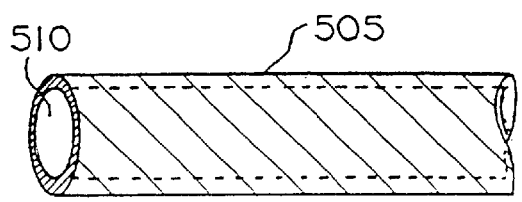
FIGS. 18(a) and 18(b) are perspective views of the ingot of the fifth embodiment and a plan view of a wafer of the fifth embodiment.
Figure 18B:
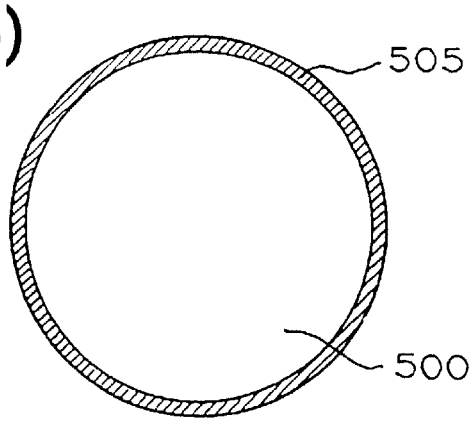

FIG. 15 is a plan view of a wafer having a side plane covered with a protection insulating film for preventing diffusion of copper, and FIG. 16 is a partial section view showing a half of a principal plane of the wafer and a half of the left portion of the wafer. FIG. 17 is a perspective view of an ingot, and FIG. 18 is a perspective view of the ingot and a plan view of the wafer. In this embodiment, the peripheral portion of the wafer 500 is covered with a protection insulating film 501 for preventing the diffusion of copper. Specifically, the portion extending from the outermost of the wafer to the central portion of the wafer by several mm, for example, 1 mm, is composed of the protection insulating film 501 formed of a silicon nitride film (FIG. 15). Accordingly, an end portion of the interlayer insulating film 503 formed of a silicon oxide film which covers the gate electrode 502 is disposed inside the external periphery of the wafer 500, and the end portion of the interlayer insulating film 503 is formed on the protection insulating film 501. Thus, even though the Cu wiring is formed on the interlayer insulating film 503, the Cu wiring does not contact with the silicon wafer directly, so that the diffusion of the copper into the wafer can be prevented (FIG. 16). Furthermore, also when a high concentration semiconductor substrate like a p-epitaxial on p$^+$ substrate is employed, the exposed portion of the rear plane at the peripheral portion of the wafer is formed of a silicon nitride (SiN), so that diffusion of impurities toward the outside of the wafer due to thermal steps during the manufacturing of the semiconductor device can be prevented.

The wafer 500 shown in FIG. 15 is manufactured in the following manner. The silicon ingot prepared, for example, by a well-known pulling-up method is processed to a predetermined diameter (FIG. 17(*a*)). In the conventional method, the ingot is sliced, thus cutting out the wafer. In this embodiment, the entire surface of the ingot 510 is subjected to a nitriding treatment, whereby the entire surface of the ingot is converted to a silicon nitride film 501 serving as a protection insulating film. As another method, there is a method in which the silicon nitride film 501 is deposited to a predetermined thickness on the surface of the ingot 510 by a chemical vapor deposition (CVD) method (FIG. 17(*b*)). The ingot 510 covered with the protection insulating film 501 formed in the above described manner is sliced to a predetermined thickness, and the surface of the sliced ingot is processed. Thus, a wafer shown in FIG. 15 is formed.

The protection insulating film for preventing the diffusion of copper, which is formed on the wafer, is not limited to the foregoing silicon nitride film, and, for example, a silicon oxide film may be satisfactory. Such silicon oxide film is formed in the following manner. An oxidation treatment by a thermal oxidation method is performed for the foregoing ingot 510 that has not been undergone a surface treatment, thus chemically converting the surface of the ingot to a silicon oxide film 505 having a predetermined thickness (FIG. 18(*a*)). As another method, there is a method to deposit a silicon oxide film 505 having a predetermined thickness on the surface of the ingot 510 by a chemical vapor deposition (CVD) method. The ingot 510 that has been subjected to the surface treatment is sliced and polished, thus obtaining a silicon wafer 500 having a peripheral portion formed of the silicon oxide film 505 (FIG. 18(*b*)).

In this embodiment, since the foregoing protection insulating film is formed on the peripheral portion of the principal plane of the wafer where the integrated circuit is formed, the peripheral portion of the principal plane of the wafer in which no photoresist is inherently formed is not exposed by etching when the Cu wiring is formed on the principal portion. Accordingly, the copper does not diffuse into the chip formation region of the wafer from this portion. Furthermore, since the rear plane of the wafer is exposed, it is expected that the copper may diffuse from the rear plane of the wafer. When such diffusion must be prevented, the protection insulating film such as a silicon oxide film or a silicon nitride film can be formed on the rear plane of the wafer after the preparation of the wafer. Among the wafer treatment steps, in a step for forming a side wall insulating film formed of a silicon nitride film, which is performed before the Cu wiring formation step, the foregoing silicon nitride film as the protection insulating film may be formed.

A sixth embodiment of the present invention will be described with reference to FIGS. 19(*a*) and 19(*b*), FIGS. 20(*a*) and 20(*b*) and FIG. 21. In this embodiment, a protection insulating film for preventing a diffusion of copper is formed by utilizing the formation of the foregoing side wall insulating film of the gate electrode. A method of this embodiment will be described below.

Figure 19A:
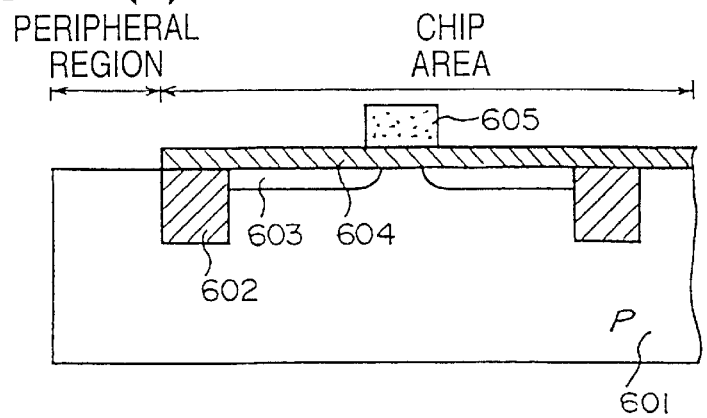
FIGS. 19(a) and 19(b) are section views showing manufacturing steps for manufacturing a semiconductor device of a sixth embodiment.
Figure 19B:
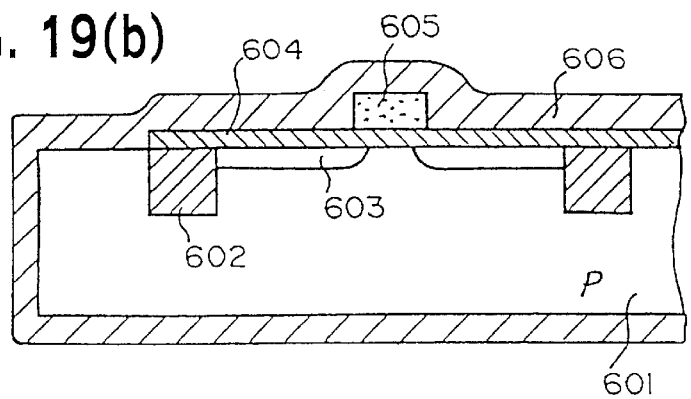
Figure 20A:
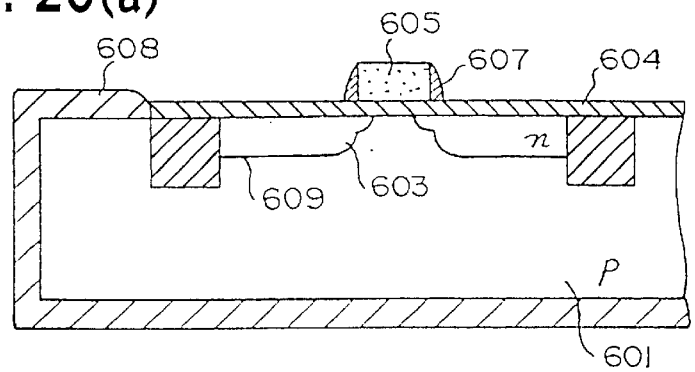
FIGS. 20(a) and 20(b) are section views showing manufacturing steps for manufacturing the semiconductor device of the sixth embodiment.

FIGS. 19(*a*) and 19(*b*) and FIGS. 20(*a*) and 20(*b*) are sectional views showing manufacturing steps of a semiconductor device of this embodiment. The semiconductor device is formed on a wafer. The wafer is finally cut, and each chip in which the semiconductor device is formed is separated from others. Accordingly, FIGS. 19(*a*) and 19(*b*) and FIGS. 20(*a*) and 20(*b*) show sectional views of the chip communicated with the peripheral portion of the wafer. This peripheral portion of the wafer is removed when the chip is separated from each other. The semiconductor device 601 is formed of, for example, a p-type silicon semiconductor. The peripheral portion of the wafer is located on the left side of the view. The inside of the peripheral portion of the wafer, that is, the central portion and right side of the drawing, are a chip region. An element isolation region 602 of a STI structure, which is formed of SiO2, is formed in the chip region by a LOCOS method. By an ion-implantation, a n-type extension region 603 and source/drain regions are formed in the element region partitioned by the element isolation region 602. A gate insulating film 604 formed of $SiO_2$ is formed on the chip region of the semiconductor substrate 601 by a thermal oxidation. A gate electrode 605 formed of polysilicon is formed on the gate insulating film 604 (FIG. 19(*a*)). Next, a silicon nitride film 606 is formed, by a LPCVD method or the like, on the entire surface of the semiconductor substrate 601, that is, on the principal plane, the external side plane and the rear plane of the wafer (FIG. 19(*b*)). Next, the portion where the protection insulating film is to be formed is masked, and a side wall insulating film 607 formed of a silicon nitride film is formed on the side surface of the gate electrode 605 by an isotropic etching such as an RIE. The protection insulating film 608 for preventing the diffusion of copper is formed on the peripheral portion, the external side plane and the rear plane of the wafer. Thereafter, impurities are implanted into source/drain formation regions using the side wall insulating film 607 as a mask, and the n-type source/drain regions 609 is formed (FIG. 20(*a*)).

Next, an interlayer insulating film 610 formed of, for example, BPSG is deposited on the semiconductor substrate 601, and flattened. Furthermore, a silicon nitride film 611 having a smaller thickness than that of the interlayer insulating film 610 is deposited on the flattened surface of the interlayer insulating film 610. A contact hole 612 reaching to any of the source/drain regions 609 is formed, and a barrier metal layer 613 formed of, for example, Ti or TiN/Ti is formed within the contact hole 612 and on the surface of the silicon nitride film 611. Furthermore, a Cu film 614 is deposited on the barrier metal layer 613. Then, a Cu wiring 614 is formed by patterning the Cu film 614 (FIG. 20(*b*)). A protection insulating film may be further formed on the Cu wiring 614, or a plurality of upper Cu wirings may be formed interposing an interlayer insulating film between the Cu wiring 614 and the upper Cu wirings during formation of the protection insulating film. As shown in FIG. 21, the side wall insulating film 608 formed of a silicon nitride film prevents the diffusion of copper into the inside of the wafer 601. Since a coefficient of diffusion of copper into the silicon nitride film is small, copper atoms and copper composition remain in the surface of the protection insulating film 608, within the protection insulating film 608 and at the interface between the protection insulating film 608 and the wafer. For this reason, it is possible to prevent the diffusion of the copper atoms and the copper composition almost perfectly.

In this embodiment, since the foregoing protection insulating film is formed in the peripheral portion of the principal plane of the wafer, in which the integrated circuit is formed, the peripheral portion of the principal plane of the wafer in which no photoresist is inherently formed is not exposed by etching when the Cu wiring is formed on the principal portion. Accordingly, the copper does not diffuse into the chip formation region of the wafer from this portion. Among the wafer treatment steps, in a step for forming a side wall insulating film formed of a silicon nitride film, which is performed before the Cu wiring formation step, the foregoing silicon nitride film as the protection insulating film may be used.

Figure 20B:
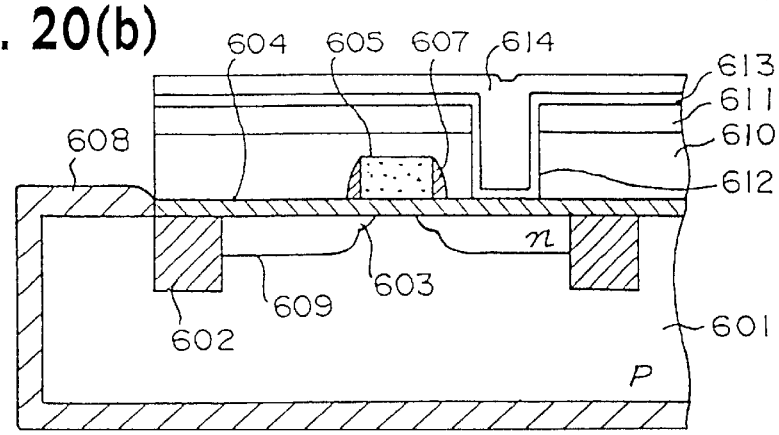
Figure 21:
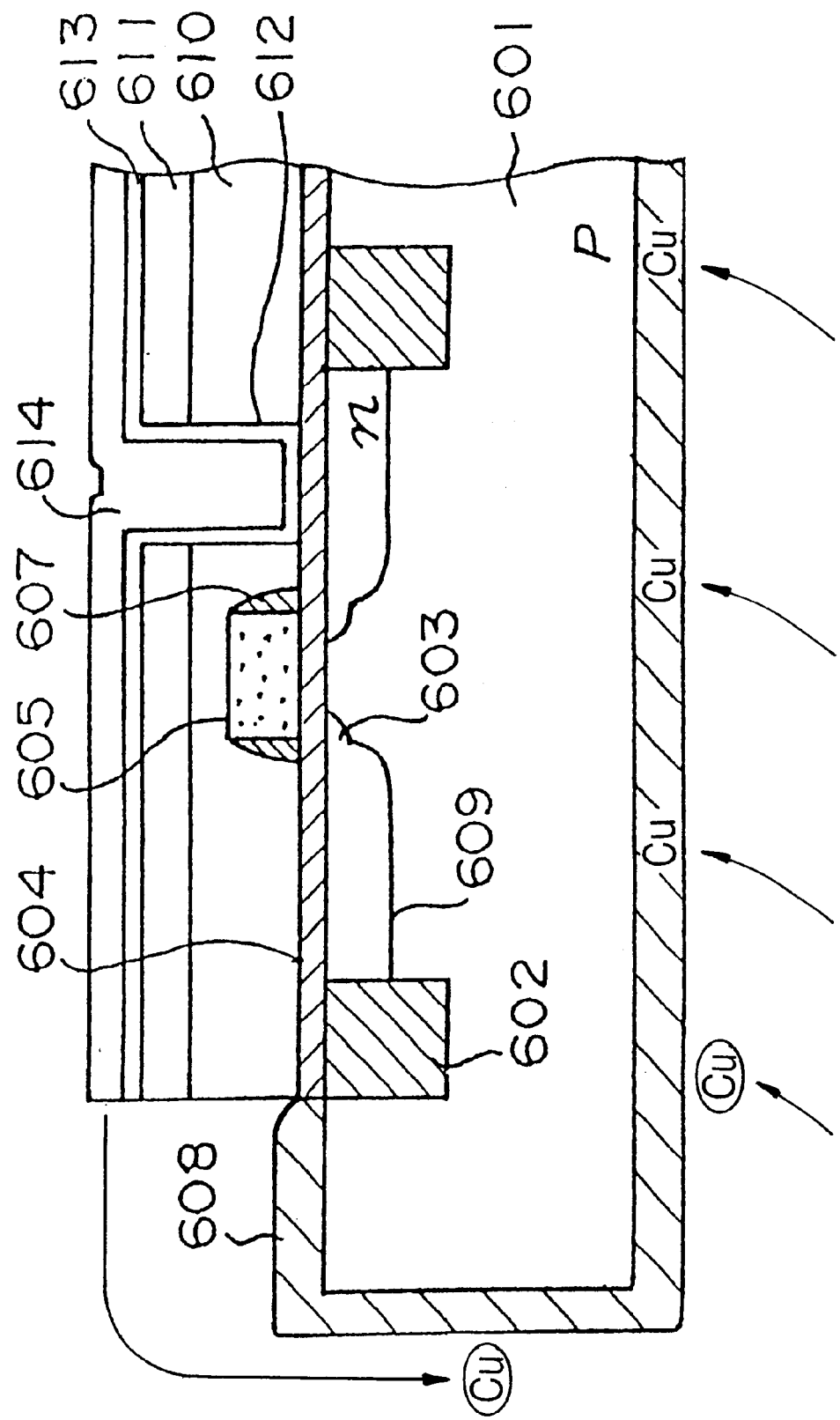
FIG. 21 is a section view showing the semiconductor device of the sixth embodiment.

In the present invention, when a part of the wafer treatment steps is employed, the protection insulating film may be formed in a step other than the side wall insulating formation step. It is possible to use any step, for example, the step for forming the silicon nitride film 611 as shown in FIG. 20(b), as long as it is a step before the Cu wiring formation step.

Since the silicon nitride film or the silicon oxide film as the protection insulating film for preventing the diffusion of the copper is formed on the peripheral portion, the external side plane and the rear plane of the wafer, it is possible to prevent the diffusion of the copper into the semiconductor substrate, so that the variation of the transistor characteristic, for example, a threshold, can be controlled. Furthermore, the protection insulating film can be formed by using a step among the wafer treatment steps for forming the integrated circuit in the chip region of the wafer, so that the manufacturing steps can be simplified.

While there has been illustrated and described what are presently considered to be preferred embodiment of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention includes all embodiments falling within the scope of the appended claims.

What is claimed is:

1. A semiconductor wafer comprising:
   a semiconductor component having:
      a first plane comprising a first part and a second part wherein an integrated circuit is formed on the first part of the first plane and no integrated circuit is formed on
      a second plane opposite the first plane;
      a side plane wherein the side plane connects the first plane and the second plane;
      a peripheral region wherein the peripheral region includes the second part of the first plane where no integrated circuit is formed and the side plane; and
      a protection film formed on said second plane and said peripheral region.

2. The semiconductor wafer according to claim 1, wherein said protection film is a silicon nitride film.

3. The semiconductor wafer according to claim 1, wherein said protection film prevents a diffusion of copper into a semiconductor substrate.

4. A semiconductor device comprising:
   a semiconductor wafer having:
      a first plane comprising a first part and a second part wherein an integrated circuit is formed on a first part of the first plane and no integrated circuit is formed on the second part of the first plane and wherein the integrated circuit comprises a copper layer;
      a second plane opposite the first plane;
      a side plane wherein the side plane connects the first plane and the second plane; and
      a peripheral region wherein the peripheral region includes the second part of the first plane where no integrated circuit is formed and the side plane; and
      a protection film formed on the second plane and the peripheral region preventing a diffusion of copper into the semiconductor wafer.

5. The semiconductor device according to claim 4, wherein the protection film prevents a diffusion of copper into the semiconductor chip through the second plane.

6. A semiconductor device comprising:
   a semiconductor substrate having:
      a first plane comprising a first part and a second part wherein an integrated circuit is formed on a first part of the first plane and no integrated circuit is formed on the second part of the first plane and wherein the integrated circuit comprises a copper layer;
      a second plane opposite the first plane;
      a side plane wherein the side plane connects the first plane and the second plane; and
      a peripheral region wherein the peripheral region includes the second part of the first plane where no integrated circuit is formed and the side plane; and
      a protection film formed on the second plane to prevent a diffusion of copper into the semiconductor substrate through the second plane.

* * * * *

UNITED STATES PATENT AND TRADEMARK OFFICE
CERTIFICATE OF CORRECTION

PATENT NO. : 6,525,402 B1
DATED : February 25, 2003
INVENTOR(S) : Matsumoto et al.

It is certified that error appears in the above-identified patent and that said Letters Patent is hereby corrected as shown below:

Title page,
Item [57], ABSTRACT,
Lines 10-11, change "a external" to -- an external --.

Column 12,
Line 7, after "formed on" insert -- the second part of the first plane --.

Signed and Sealed this

Twelfth Day of August, 2003

JAMES E. ROGAN
*Director of the United States Patent and Trademark Office*